United States Patent
Hause et al.

(10) Patent No.: US 6,218,250 B1
(45) Date of Patent: Apr. 17, 2001

(54) METHOD AND APPARATUS FOR MINIMIZING PARASITIC RESISTANCE OF SEMICONDUCTOR DEVICES

(75) Inventors: Frederick N. Hause, Austin, TX (US); Karsten Wieczorek, Reichenberg-Boxdorf; Manfred Horstmann, Dresde, both of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/324,183

(22) Filed: Jun. 2, 1999

(51) Int. Cl.$^7$ .................................................. H01L 21/336
(52) U.S. Cl. .......................... 438/302; 438/525; 438/529
(58) Field of Search ..................................... 438/302, 305, 438/217, 525, 529, FOR 169, FOR 188, FOR 196, FOR 185, FOR 199

(56) References Cited

U.S. PATENT DOCUMENTS

| | | | |
|---|---|---|---|
| 5,733,792 | * | 3/1998 | Masuoka . |
| 5,851,890 | * | 12/1998 | Tsai et al. . |
| 6,063,681 | * | 5/2000 | Son . |
| 6,066,532 | * | 5/2000 | Chen et al. . |

OTHER PUBLICATIONS

Mantl et al., "The effect of dose on the growth of buried $CoSi_2$ layers in (111) and (100) Si produced by ion implantation," *Nuclear Instruments and Methods in Physics Research*, B59/60:666–670, 1991.

Radermacher et al., "Temperature and energy dependence of ion–beam synthesis of epitxial $Si/CoSi_2/Si$ heterostructures, "*J. Appl. Phys.*, 68(6):3001–3008, 1990.

\* cited by examiner

Primary Examiner—George Fourson
Assistant Examiner—Joannie A. Garcia
(74) Attorney, Agent, or Firm—Williams, Morgan & Amerson, P.C.

(57) ABSTRACT

A semiconductor device includes a substrate, a gate structure, a plurality of sidewall spacers, and a plurality of first silicide layers. The gate structure is positioned above the substrate. The plurality of sidewall spacers are positioned adjacent to the gate structure. The first silicide layers are positioned in the substrate and have first ends that extend underneath the sidewall spacers. A method for forming a semiconductor device includes forming a gate structure above a substrate. A plurality of sidewall spacers are formed adjacent the gate structure. An implant material is disposed into the substrate using a tilted implantation process that is adapted to form first implant regions in the substrate. The implant regions have first ends that extend underneath the sidewall spacers by a first distance.

37 Claims, 5 Drawing Sheets

METHOD AND APPARATUS FOR MINIMIZING PARASITIC RESISTANCE OF SEMICONDUCTOR DEVICES

BACKGROUND OF THE INVENTION

1. Field of the Invention

This invention relates generally to semiconductor processing and, more particularly, to minimizing parasitic resistances in semiconductor devices.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor, e.g., channel length, junction depths, gate dielectric thickness, etc., are reduced. For example, all other things being equal, the smaller the channel length of the transistor, the faster the transistor will operate. Thus, there is a constant drive to reduce the size or scale of the components of a typical transistor to increase the overall speed of the transistor, as well as integrated circuit devices incorporating such transistors.

Generally, a field effect transistor is comprised of a semiconductor substrate having source/drain regions formed therein. The source/drain regions may be separated by a distance roughly equivalent to the width of a gate structure formed above a surface of the semiconductor substrate. Furthermore, sidewall spacers may be formed adjacent to the gate structure and may function to electrically isolate the gate structure from the source/drain regions. Those skilled in the art will appreciate that, prior to forming the sidewall spacers, lightly doped regions may be formed in the semiconductor substrate adjacent to the gate structure. Once the transistor is formed, portions of the lightly doped regions and the source/drain regions may be positioned in the semiconductor substrate underneath the sidewall spacers. The lightly doped regions and the source/drain regions together may form the familiar lightly doped drain (LDD) structure.

Those skilled in the art will appreciate that, during normal operation, the gate structure and the source/drain regions may be coupled to various inputs and supply voltages. Moreover, during normal operation, a transistor drive current may be determined by, among other things, the resistance between the source/drain regions, which is typically referred to as $R_{on}$. As a general rule, the drive current of a transistor may be increased by decreasing $R_{on}$, and conversely, the drive current of a transistor may be decreased by increasing $R_{on}$ (i.e., transistor drive current varies inversely with $R_{on}$.) Furthermore, the operating speed of the transistor may vary directly with drive current. As a general rule, all other things being equal, increasing the transistor drive current increases the transistor operating speed. For example, by increasing the drive current, a transistor that normally operates at 400 MHz may be made to operate at 500 MHz.

One method currently used to decrease $R_{on}$ and, thus, improve the operating speed of field effect transistors, is salicide-processing of the source/drain regions. For example, a thin metal film may be deposited above the surface of the source/drain regions. Once deposited, the transistor may be exposed to a heating process, which may result in the diffusion of the deposited metal film into the exposed portions of the source/drain regions. Next, the non-reacted portion of the metal film may be selectively removed (i.e., the non-diffused portion of the metal film is removed), and the transistor may be exposed to a second heating process resulting in the formation of silicide in and above the source/drain regions. This process tends to make the source/drain regions more conductive.

A significant contributor to $R_{on}$ is high parasitic resistance caused by the poor conductivity of the LDD-layers underneath the sidewall spacers. Unfortunately, the LDD-layers positioned underneath the sidewall spacers are unaffected by conventional salicide-processing. Consequently, the parasitic resistance associated with the LDD-layers positioned under the sidewall spacers may not be reduced using conventional salicide-processing. Furthermore, conventional salicide-processing requires multiple processing steps, which may increase manufacturing complexity and cost.

The present invention is directed to overcoming, or at least reducing the effects of, one or more of the problems set forth above.

SUMMARY OF THE INVENTION

One aspect of the present invention is seen in a semiconductor device including a substrate, a gate structure, a plurality of sidewall spacers, and a plurality of first silicide layers. The gate structure is positioned above the substrate. The plurality of sidewall spacers are positioned adjacent to the gate structure. The first silicide layers are positioned in the substrate and have first ends that extend underneath the sidewall spacers.

Another aspect of the present invention is seen in a method for forming a semiconductor device. The method includes forming a gate structure above a substrate. A plurality of sidewall spacers are formed adjacent the gate structure. An implant material is disposed into the substrate using a tilted implantation process that is adapted to form first implant regions in the substrate. The implant regions have first ends that extend underneath the sidewall spacers by a first distance.

BRIEF DESCRIPTION OF THE DRAWINGS

The invention may be best understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 1:
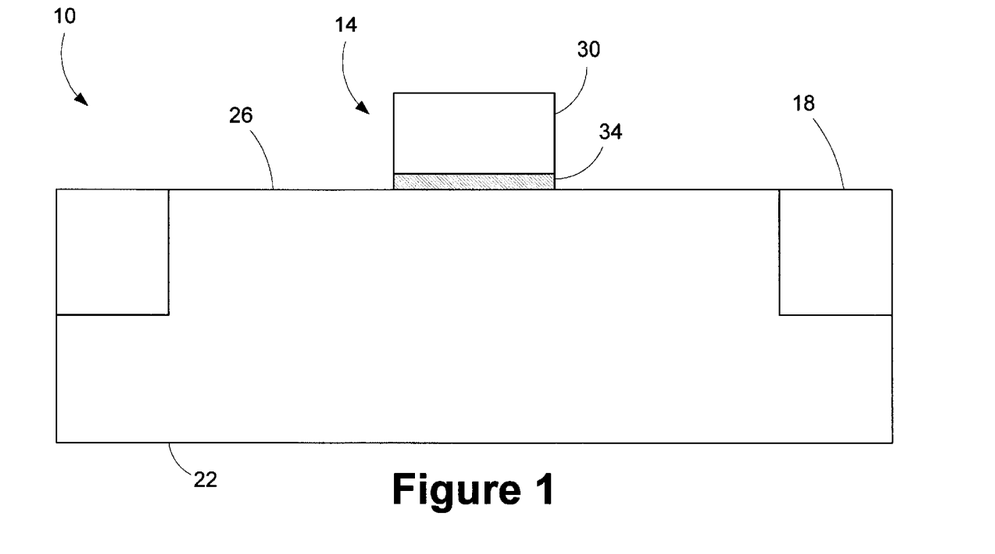
FIG. 1 is a cross-sectional view of a partially formed field effect transistor.

In FIG. 1, an illustrative embodiment of a partially formed transistor structure 10 is shown. In one embodiment, the transistor structure 10 is comprised of a gate structure 14 and a plurality of isolation structures 18. The transistor structure 10 may be formed in a semiconductor substrate 22 that may be comprised of a variety of materials, such as silicon.

The isolation structures 18 may be comprised of a variety of structures, such as local oxidation of silicon (LOCOS), shallow trench isolation, or any other structure capable of electrically isolating adjacent components. Those skilled in the art will appreciate that the isolation structure 18 may be formed using a variety of know processes and that the particular embodiment and materials selected may vary depending upon the application. In one embodiment, the isolation structure 18 is shallow trench isolation with silicon dioxide ($SiO_2$) formed therein.

Those skilled in the art will appreciate that the gate structure 14 may be formed above a surface 26 of the substrate 22 using a variety of known processes. In one embodiment, the gate structure 14 may be formed having a gate conductor 30 positioned above a gate dielectric 34. As will be apparent upon a complete reading of the present application, the gate structure 14 may be formed using a variety of materials and techniques. Thus, the particular size, materials of construction, and processes described herein for forming the gate structure 14 should not be considered a limitation of the present invention.

The gate dielectric 34 may be comprised of a portion of a first process layer (not shown) that may be formed above the surface 26 of the substrate 22. In one embodiment, the first process layer may be comprised of thermally grown silicon dioxide ($SiO_2$) having a thickness that ranges from approximately 25–50 Å. Alternatively, the first process layer may be comprised of a variety of insulating materials. Moreover, the first process layer may be deposited using chemical vapor deposition (CVD), plasma enhanced chemical vapor deposition (PECVD), low pressure chemical vapor deposition (LPCVD), or any other similar process.

The gate conductor 30 may be comprised of a portion of a second process layer (not shown) that may be formed above the first process layer. Those skilled in the art will appreciate that the second process layer may be comprised of a variety of materials, such as metal, doped or undoped polysilicon, or any other similar material. In one embodiment, the second process layer may be comprised of polysilicon that may be deposited using CVD, PECVD, LPCVD, or any other similar process. In addition, the second process layer may have a thickness ranging from approximately 1000–2000 Å.

Once the first and second process layers are formed above the surface 26 of the substrate 22, the gate structure 14 may be formed by patterning and etching the first and second process layers using traditional photolithography. For example, a layer of photoresist (not shown) may be deposited above the second process layer, and by selectively removing a portion of the layer of photoresist, the first and second process layers may be selectively exposed to an anisotropic etching process.

Figure 2:
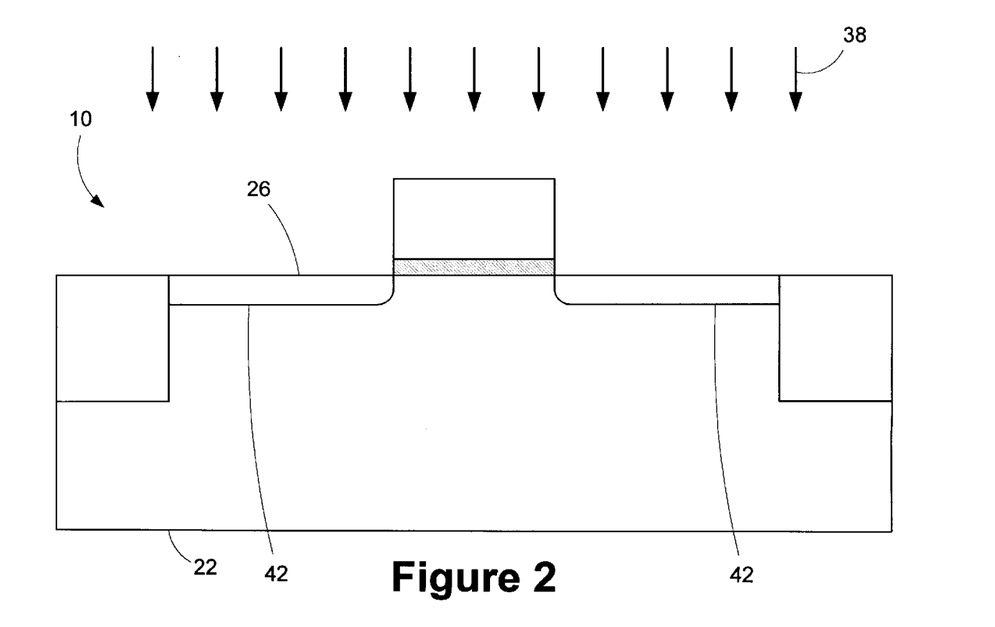
FIG. 2 is a cross-sectional view of the transistor of FIG. 1 having lightly doped regions formed therein.

In FIG. 2, the surface 26 of the substrate 22 may be exposed to a first ion implantation process, as indicated by arrows 38. Those skilled in the art will appreciate that the first ion implantation process may be used to form lightly doped regions 42 in the substrate 22 and that the doping material used may vary depending upon the application. For example, depending upon the technology (e.g., PMOS, NMOS, CMOS, etc.) the lightly doped regions 42 may be doped N-type or P-type. Moreover, the lightly doped regions 42 may be doped with, for example, arsenic and/or phosphorous for NMOS technology, and the lightly doped regions 42 may be doped with, for example, boron and/or $BF_2$ for PMOS technology. In one embodiment, the lightly doped regions 42 are doped with arsenic (for NMOS technology), and the doping concentration ranges from approximately $5\times10^{14}$–$2\times10^{15}$ ions/cm$^2$ at an energy level of approximately 2–30 keV.

Figure 3:
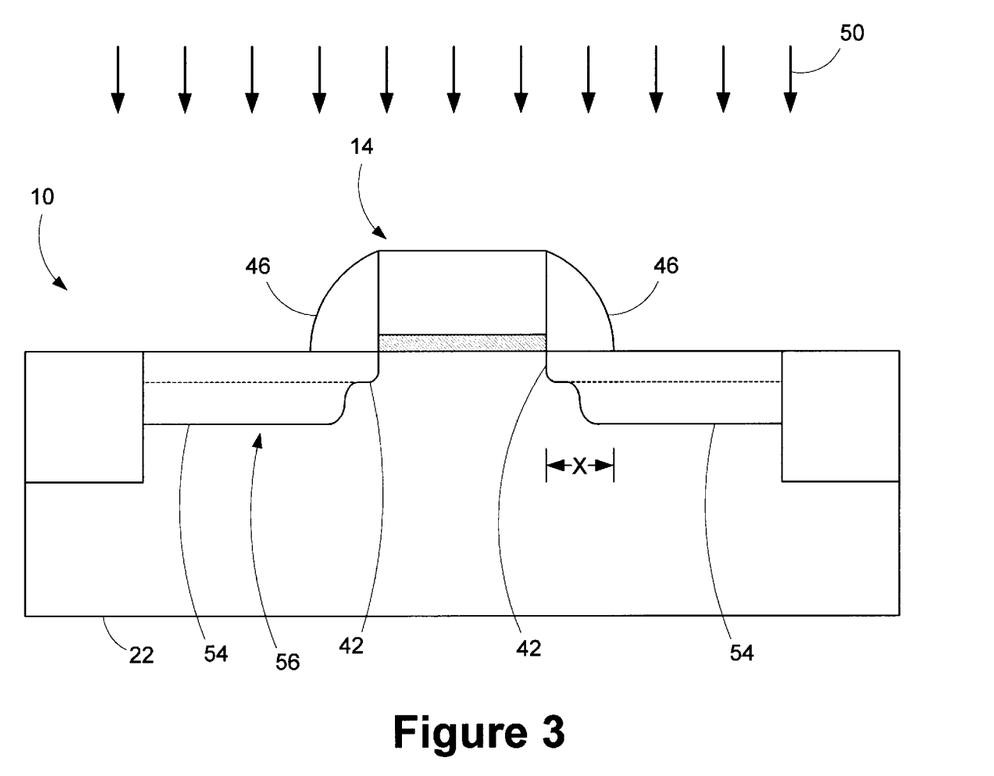
FIG. 3 is a cross-sectional view of the transistor of FIG. 2 having laterally diffused source/drain regions formed therein.

In FIG. 3, a plurality of sidewall spacers 46 may be formed adjacent the gate structure 14 by the deposition of a conformal layer (not shown) of the appropriate spacer material over the gate structure 14 followed by an anisotropic etch of the conformal layer. The sidewall spacers 46 may be comprised of a variety of materials, such as silicon dioxide ($SiO_2$), silicon nitride, or any other appropriate material. In one embodiment, the sidewall spacers 46 are comprised of silicon dioxide ($SiO_2$) and are formed having a width, as indicated by the distance "X", of approximately 200–1000 Å.

Once the sidewall spacers 46 are formed, the substrate 22 may be subjected to a second ion implantation, as indicated by arrows 50. Those skilled in the art will appreciate that the second ion implantation process may be used to form source/drain regions 54 in the substrate 22. Once the second ion implantation is completed, the source/drain regions 54 and the previously formed lightly doped regions 42 together form the familiar lightly doped drain (LDD) structure 56. As discussed above for the lightly doped regions 42, the source/drain regions 54 may be doped with a variety of materials that may vary depending upon the application. In one embodiment, the source/drain regions 54 are doped with arsenic or phosphorous (NMOS technology) having a concentration level of approximately $1-4\times10^{15}$ ions/cm$^2$ at an energy level of approximately 10–50 keV.

In one embodiment, once the source/drain regions 54 are formed, the transistor structure 10 may be subjected to a rapid thermal anneal (RTA) process. For example, the transistor structure 10 may be heated in a rapid thermal anneal chamber to a temperature of 800–1100° C. for approximately 15–60 seconds. Those skilled in the art will appreciate that the rapid thermal anneal (RTA) process may repair the damaged caused to the substrate 22 during the implantation of the lightly doped regions 42 and the source/drain regions 54. In addition, the RTA process may result in the lateral diffusion of the source/drain regions 54. For example, in FIG. 3, the source/drain regions 54 are shown laterally diffused inward toward the gate structure 14. Those skilled in the art will appreciate that the lightly doped regions 42 may be doped at a lower concentration level as compared to the more heavily doped source/drain regions 54. Thus, although the RTA process may repair the damage to the substrate 22, the lightly doped regions 42 may not laterally diffuse to any significant degree as a result of the RTA process as compared to the source/drain regions 54. For example, as shown in FIG. 3, the position of the lightly doped regions 42 are substantially unaffected by the RTA process.

Figure 4:
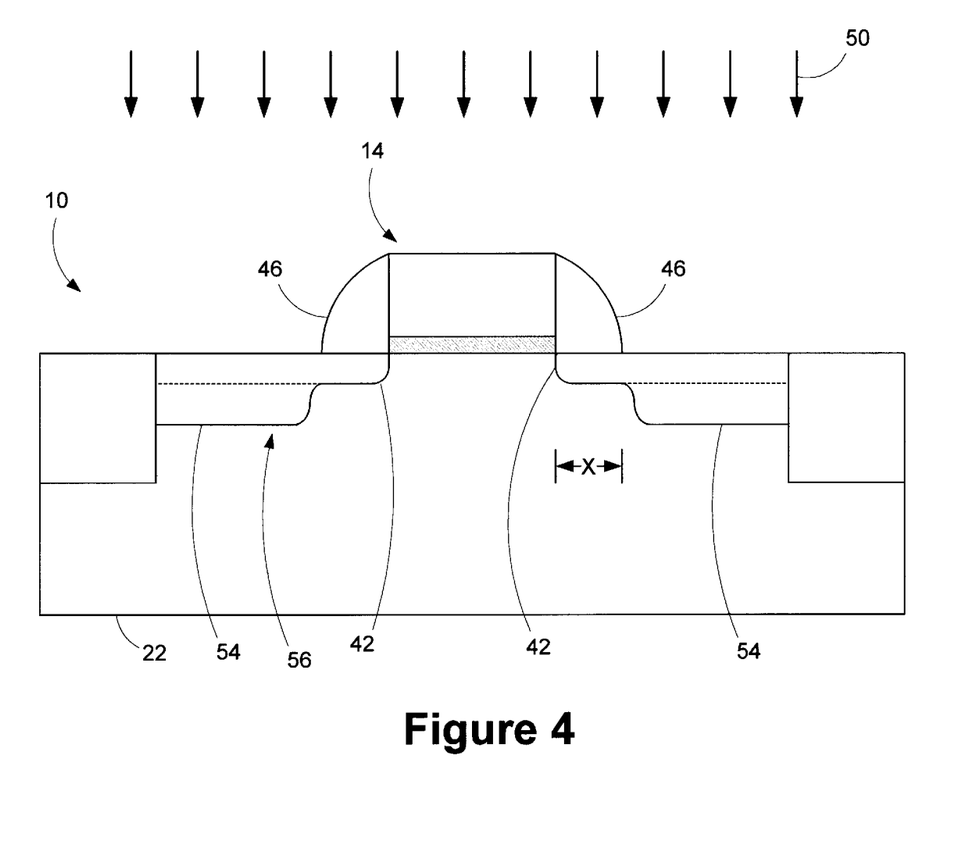
FIG. 4 is a cross-sectional view of the transistor of FIG. 2 having self-aligned source/drain regions formed therein.

Alternatively, it is contemplated that the substrate 22 may remain unannealed after the first and second ion implantation processes (i.e., the transistor structure 10 is not subjected to the RTA process described above.) In FIG. 4, the transistor structure 10 is unannealed, and the source/drain regions 54 are shown substantially self-aligned with the sidewall spacers 46. Those skilled in the art will appreciate that, because the transistor structure 10 is not annealed, the source/drain regions 54 are not laterally diffused toward the gate structure 14. As will be illustrated below, to increase efficiency, it is contemplated that the RTA anneal may be combined with the salicide-processing, thus, removing the additional RTA processing step described above.

Figure 5:
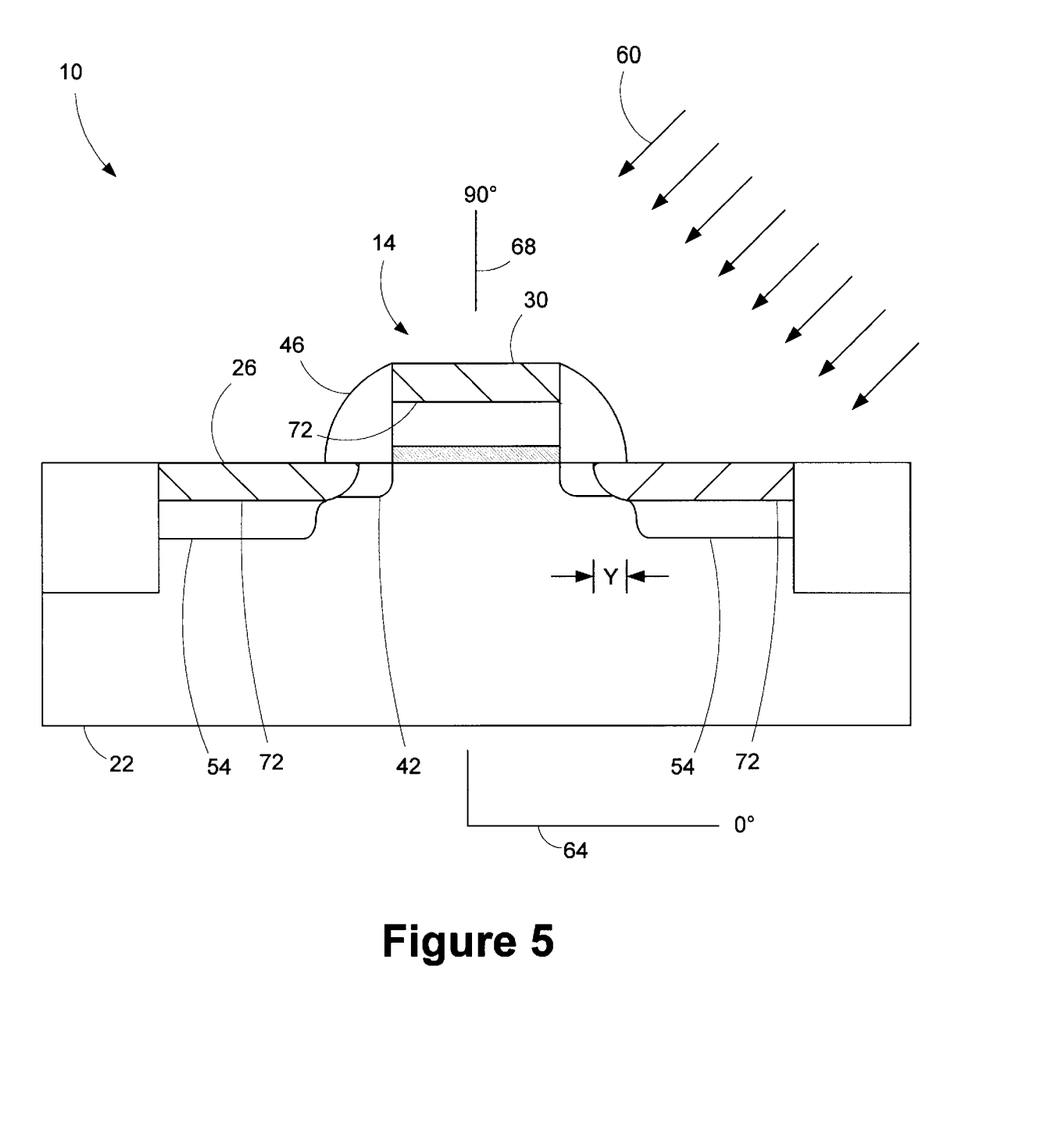
FIG. 5 is a cross-sectional view of the transistor of FIG. 3 being subjected to a tilted implantation in accordance with one embodiment of the present invention.

In FIG. 5, the transistor structure 10 may be subjected to a tilted implantation process, as indicated by arrows 60. It is contemplated that the tilted implantation process may be performed at an angle with respect to the surface 26 of the substrate 22. For illustrative purposes, a horizontal axis 64 is labeled at 0 degrees and a vertical axis 68 is labeled at 90 degrees.

It is contemplated that the tilted implantation process may be used to form a plurality of implant regions 72. The tilted implantation process may utilize a variety of implant materials to form the implant regions 72. For example a variety of refractory metals such as titanium, tungsten, molybdenum, zirconium, titanium, or any other similar material capable of forming a silicide with a resistivity of approximately 13–50 $\mu\Omega$-cm may be used to form the implant regions 72. In one embodiment, the implant material is Cobalt. As will be illustrated below, Cobalt may be used to form CoSi$_2$ a silicide having a resistivity of approximately 16–20 $\mu\Omega$-cm. It is contemplated that the tilted implantation process may "drive" implant materials, such as Cobalt, into the gate conductor 30 and the source/drain regions 54. Moreover, as a result of the tilted implantation process, the implant regions 72 may extend laterally underneath the sidewall spacers 46, as shown in FIG. 4 by the distance "Y".

In one embodiment, the tilted implantation process may be performed at an angle of approximately 30–60 degrees at a concentration level of approximately $1\times10^{16}-1\times10^{17}$ ions/cm$^2$. It is contemplated that the angle of the tilted implantation process may be varied as a matter of design choice, and as will be illustrated below, the selected implant angle may determine, among other things, the lateral extension of the implant regions 72 underneath the sidewall spacers 46 (i.e., the distance "Y".)

In order to avoid "shadowing" by the gate structure 14, the transistor structure 10 may be rotated during the tilted implantation process. For example, the tilted implantation process may be partitioned into four parts with the transistor structure 10 being rotated a quarter turn during each partition to ensure equal implantation of the implant material. Although not shown, a screen oxide may be formed on the surface 26 of the substrate 22 above the source/drain regions 54. Those skilled in the art will appreciate that the screen oxide may be used to adjust the profile of the implant regions 72 in the substrate 22.

As described above, the source/drain regions 54 may remain unannealed after the first and second ion implantation processes, thus removing an additional RTA processing step. As a result of not performing the RTA process described above, the lightly doped regions 42 and the source/drain regions 54 are relatively amorphous and better adapted to receive the implant material during the tilted implantation process. For example, the first and second ion implantation processes may damage the crystal lattice of the exposed portions of the substrate 22. Because the crystal lattice is damaged and not repaired by the RTA process described above, the implant material is more easily received by the lightly doped regions 42 and the source/drain regions 54. Alternatively, when the source/drain regions 54 and the lightly doped regions 42 are not amorphous (e.g., after the crystal lattice of the substrate 22 is repaired by the RTA anneal) the tilted implantation process may result in transient enhanced diffusion (TED). Transient enhanced diffusion is the undesirable result of the lightly doped regions 42 being driven underneath the gate dielectric 34 in response to the tilted implantation process. It is contemplated that by not performing the RTA process after the first and second ion implantation processes significant additional damage to the crystal lattice of the substrate 22 may be reduced during the tilted implantation process and TED may be avoided.

It is contemplated that the depth or thickness of the implant regions 72 and the amount of lateral extension underneath the sidewall spacers 46 may be determined by, among other things, the angle of the tilted implantation process. For example, an angle of approximately 45 degrees may result in the lateral extension of the implant regions 72 underneath the sidewall spacers 46 being substantially equal to the thickness of the implant regions 72 (i.e., the thickness of the implant regions 72 may be substantially equal to the distance "Y".) Furthermore, by decreasing the implant angle, the lateral extension of the implant regions 72 underneath the sidewall spacers 46 may be increased, and the thickness of the implant regions 72 may be decreased. Conversely, by increasing the implant angle, the lateral extension of the implant regions underneath the sidewall spacers 46 may be decreased, and the thickness of the implant regions 72 may be increased. It is contemplated that the angle of the tilted implantation process may be varied as a matter of design choice depending upon the desired lateral extension and thickness of the implant regions 72. In one embodiment, the implant regions 72 are formed having a thickness of approximately 200–500 Å.

Figure 6:
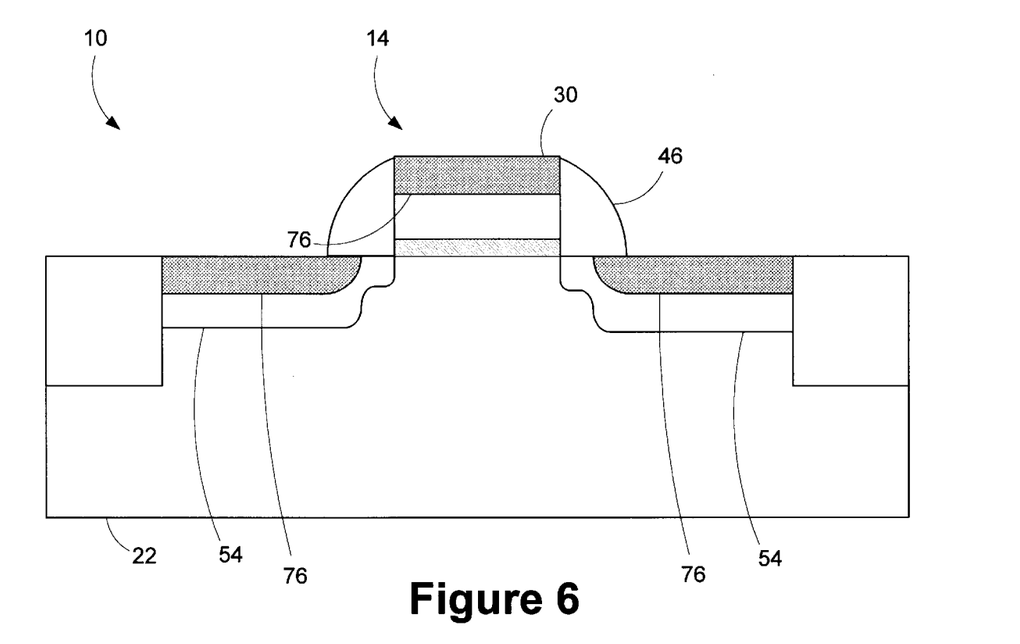
FIG. 6 is a cross-sectional view of the transistor of FIG. 4 having a silicide layer formed thereon in accordance with one embodiment of the present invention.

Once the implant regions 72 are formed, the transistor structure 10 may be subjected to a heating process. As shown in FIG. 6, the heating process may convert the implant regions 72 into silicide layers 76 by reaction of the implant material with the silicon substrate 22 and gate conductor 30. For example, if the implant material is Co, the heating process may produce silicide layers 76 comprised of $CoSi_2$. In one embodiment, the transistor structure 10 may be heated in a rapid thermal anneal (RTA) chamber to a temperature of 800–1100° C. for approximately 10–60 seconds. As will be apparent to those skilled in the art, this heating process may be accomplished by a variety of known techniques.

In addition to forming the silicide layers 76, the heating process may be used to anneal the source/drain regions 54. As discussed above, rather than annealing the source/drain regions 54 after the first and second ion implantation processes, the source/drain regions 54 may be annealed during the formation of the silicide layers 76, thus, eliminating an additional processing step. Furthermore, it is contemplated that the heating process may result in the lateral diffusion of the source/drain regions 54 toward the gate structure 14. As shown in FIG. 6, the implant regions 72 may not laterally diffuse to any significant degree during the heating process but rather are converted into the silicide layers 76. Moreover, it is contemplated that the source/drain regions 54 may be laterally diffused such that the extended portion of the silicide layers 76 underneath the sidewall spacers 46 are contained entirely within the source/drain regions 54.

It is generally desirable to have the silicide layers 76 contained entirely within the source/drain regions 54. It is contemplated that a variety of methods may be used to ensure the silicide layers 76 are positioned within the source/drain regions 54. For example, the source/drain regions 54 may be laterally diffused while converting the implant regions 72 into the silicide layers 76, as described above. Generally, the longer the substrate 22 is exposed to the heating process the greater the lateral diffusion of the source/drain regions 54. Alternatively, to achieve the same result, the angle of the tilted implantation process may be selected such that the silicide layers 76 extend laterally underneath the sidewall spacers 46 but do not extend beyond the source/drain regions 54. For example, by increasing the angle of the tilted implantation process, the lateral extension of the implant regions 72 underneath the sidewall spacers 46 may be reduced. Furthermore, the lateral diffusion of the source/drain regions 54 and the angle of the tilted implantation process may be adjusted simultaneously to ensure the silicide layers 76 are positioned within the source/drain regions 54.

In one embodiment, the implant material may penetrate and become embedded in the sidewall spacers 46 during the tilted implantation process. Because the implant material does not significantly affect the insulating characteristics of the dielectric material of the sidewall spacers 46, selective etching or processing of any unreacted implant material embedded or positioned on the sidewall spacers is not required. Thus, an additional processing step may be avoided. Once the transistor 10 is formed, conventional processes may be followed to connect the gate conductor 30 and the source/drain regions 54 with external circuitry.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, comprising:
    forming a gate structure above a substrate;
    forming a plurality of sidewall spacers adjacent the gate structure; and
    disposing an implant material into the substrate using a tilted implantation process that is adapted to form first implant regions in the substrate, the first implant regions having first ends that extend underneath the sidewall spacers by a first distance.

2. The method of claim 1, wherein disposing the implant material into the substrate comprises rotating the semiconductor device during the tilted implantation process.

3. The method of claim 1, wherein disposing the implant material into the substrate comprises disposing the implant material at an implant angle of approximately 30–60 degrees with respect to a surface of the substrate.

4. The method of claim 3, further comprising adjusting the first distance by varying the implant angle.

5. The method of claim 4, wherein adjusting the first distance comprises increasing the first distance by decreasing the implant angle.

6. The method of claim 4, wherein adjusting the first distance comprises decreasing the first distance by increasing the implant angle.

7. The method of claim 3, further comprising adjusting a thickness of the implant regions by varying the implant angle.

8. The method of claim 7, wherein adjusting the thickness of the implant regions comprises increasing the thickness by increasing the implant angle.

9. The method of claim 7, wherein adjusting the thickness of the implant regions comprises decreasing the thickness by decreasing the implant angle.

10. The method of claim 1, wherein disposing the implant material into the substrate comprises disposing the implant material at a concentration level ranging from approximately $1 \times 10^{16}$–$1 \times 10^{17}$ ions/cm$^2$.

11. The method of claim 1, further comprising forming a plurality of lightly doped regions in the substrate adjacent the gate structure.

12. The method of claim 1, further comprising forming a plurality of source/drain regions in the substrate.

13. The method of claim 12, wherein forming the source/drain regions comprises self-aligning the source/drain regions with the sidewall spacers.

14. The method of claim 12, further comprising heating the semiconductor device, the source/drain regions being laterally diffused toward the gate structure.

15. The method of claim 14, wherein heating the substrate comprises heating the substrate in a rapid thermal anneal chamber at a temperature of 800–1100° C. for approximately 15–60 seconds.

16. The method of claim 1, further comprising heating the semiconductor device to convert the first implant regions into first silicide layers, the first silicide layers having first ends that extend underneath the sidewall spacers.

17. The method of claim 16, wherein heating the semiconductor device comprises forming the first silicide layers with the first ends extending underneath the sidewall spacers by approximately the first distance.

18. The method of claim 16, wherein heating the semiconductor device comprises laterally diffusing the source/drain regions toward the gate structure, the silicide layers being contained within the diffused source/drain regions.

19. The method of claim 16, wherein heating the semiconductor device comprises heating the semiconductor device in a rapid thermal anneal chamber at a temperature of 800–1000° C. for approximately 10–60 seconds.

20. The method of claim 1, further comprising forming a second implant region in the gate structure.

21. The method of claim 20, further comprising heating the semiconductor device, the second implant region forming a second silicide layer in the gate structure.

22. The method of claim 1, wherein disposing an implant material into the substrate comprises disposing an implant material comprised of a refractory metal adapted to form a silicide layer having a resistivity of approximately 13–50 $\mu\Omega$-cm.

23. The method of claim 22, wherein disposing an implant material into the substrate comprises disposing an implant material comprised of at least one of the group of Co, Ti, Zr, W, and Mo.

24. A method for forming a semiconductor device, comprising:

forming a gate structure above a substrate;

forming a plurality of lightly doped regions in the substrate adjacent the gate structure;

forming a plurality of sidewall spacers adjacent the gate structure;

forming a plurality of source/drain regions in the substrate;

disposing an implant material into the substrate using a tilted implantation process that is adapted to form first implant regions in the substrate, the first implant regions having first ends that extend underneath the sidewall spacers by a first distance; and heating the semiconductor device to convert the first implant regions into first silicide layers, the first silicide layers having first ends that extend underneath the sidewall spacers.

25. The method of claim 24, wherein disposing the implant material into the substrate comprises disposing the implant material at an implant angle of approximately 30–60 degrees with respect to a surface of the substrate.

26. The method of claim 25, further comprising adjusting the first distance by varying the implant angle.

27. The method of claim 26, wherein adjusting the first distance comprises increasing the first distance by decreasing the implant angle.

28. The method of claim 26, wherein adjusting the first distance comprises decreasing the first distance by increasing the implant angle.

29. The method of claim 25, further comprising adjusting a thickness of the implant regions by varying the implant angle.

30. The method of claim 29, wherein adjusting the thickness of the implant regions comprises increasing the thickness by increasing the implant angle.

31. The method of claim 29, wherein adjusting the thickness of the implant regions comprises decreasing the thickness by decreasing the implant angle.

32. The method of claim 24, wherein disposing the implant material into the substrate comprises rotating the semiconductor device during the tilted implantation process.

33. The method of claim 24, wherein heating the semiconductor device comprises laterally diffusing the source/drain regions toward the gate structure, the silicide layers being contained within the diffused source/drain regions.

34. The method of claim 24, wherein heating the semiconductor device comprises heating the semiconductor device in a rapid thermal anneal chamber at a temperature of 800–1000° C. for approximately 10–60 seconds.

35. The method of claim 24, wherein heating the semiconductor device comprises forming the first silicide layers with the first ends extending underneath the sidewall spacers by approximately the first distance.

36. The method of claim 24, further comprising forming a second implant region in the gate structure.

37. The method of claim 36, further comprising heating the semiconductor device, the second implant region forming a second silicide layer.

* * * * *